(12) United States Patent
Kim

(10) Patent No.: US 6,682,974 B2
(45) Date of Patent: Jan. 27, 2004

(54) FABRICATING CAPACITOR OF SEMICONDUCTOR DEVICE

(75) Inventor: Kyong-Min Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/164,310

(22) Filed: Jun. 7, 2002

(65) Prior Publication Data

US 2003/0008454 A1 Jan. 9, 2003

(30) Foreign Application Priority Data

Jun. 12, 2001 (KR) ........................................ 2001-32687

(51) Int. Cl.[7] .......................................... H01L 21/8242
(52) U.S. Cl. ........................ 438/240; 438/784; 438/246
(58) Field of Search ................................. 438/240, 246, 438/784, 247, 210, 239, 659

(56) References Cited

U.S. PATENT DOCUMENTS

| | | | |
|---|---|---|---|
| 5,886,368 A | 3/1999 | Forbes et al. | |
| 5,926,740 A | 7/1999 | Forbes et al. | |
| 5,985,730 A | 11/1999 | Lim | |
| 6,015,917 A | 1/2000 | Bhandari et al. | |
| 6,031,263 A | 2/2000 | Forbes et al. | |
| 6,057,628 A | 5/2000 | Viljoen et al. | |
| 6,166,401 A | 12/2000 | Forbes | |
| 6,200,847 B1 * | 3/2001 | Kishiro | ........................ 438/240 |

FOREIGN PATENT DOCUMENTS

JP   11-145423   5/1999

OTHER PUBLICATIONS

S.–E. Park, et al. "RuO2 thin film fabrication with plasma–enhanced chemical vapor deposition" Thin Solid Films (Mar. 12, 1999) vol. 341, No. 1–2, p. 52–4.*

* cited by examiner

Primary Examiner—Caridad Everhart
(74) Attorney, Agent, or Firm—Pillsbury Winthrop LLP

(57) ABSTRACT

Disclosed is a method for fabricating a capacitor in a semiconductor device. A semiconductor substrate is provided. A bottom electrode is formed on the substrate by sequentially depositing Ru through a PECVD process and Ru through a LPCVD process on the semiconductor substrate. A $Ta_2O_5$ dielectric layer is formed on the bottom electrode and forming a top electrode on the $Ta_2O_5$ dielectric layer.

17 Claims, 5 Drawing Sheets

FABRICATING CAPACITOR OF SEMICONDUCTOR DEVICE

BACKGROUND

The inventions described and/or claimed in this patent relate in general to fabricating a capacitor of a semiconductor device; and, more particularly, to a method for fabricating a TaON or $Ta_2O_5$ capacitor.

As the integration density of semiconductor devices increases, the size of a memory cell, which stores 1-bit of information, decreases. However, it is a problem to reduce the size of a capacitor without changing its capacitance value and compromising its ability to act as needed to protect from soft error and to maintain a stable operation. The size of a conventional capacitor cannot be reduced in proportion to the reduction of cell size. Accordingly, efforts have been made to find ways to provide the value of capacitance required in a smaller cell. Some of these efforts have focused on reducing the thickness of a dielectric layer of the capacitor, increasing an effective area of the capacitor and a using materials having high dielectric constant. When considering the materials having high dielectric constant, a $SiO_2$ layer is conventionally used as a dielectric layer in the capacitor and also a NO (Nitride-Oxide) layer or an ONO (Oxide-Nitride-Oxide) layer, which has a dielectric constant that is two times as high as that of the $SiO_2$ layer. However, since the $SiO_2$, NO and ONO layers have the low dielectric constant, high capacitance is not expected even if the surface area of the layer is made wider and the thickness of the layer is reduced. (Ba, Sr)$TiO_3$ (hereinafter, referred to as BST), (Pb, Zr)$TiO_3$ (hereinafter, referred to as PZT) and $Ta_2O_5$ are used as dielectric materials instead of the conventional dielectric materials. The dielectric constant of the $Ta_2O_5$ layer is three times (about 20 to 25) that of the silicon nitride and the $Ta_2O_5$ layer is easily etched, compared with the BST layer or the PZT layer. Also, when the $Ta_2O_5$ dielectric layer is deposited by the chemical vapor deposition (CVD), a good characteristic of step coverage is expected. Recently, a TaON layer has been developed to improve an unstable stoichiometry of the $Ta_2O_5$ layer.

Selection of electrode materials, in the capacitor using the high dielectric constant materials, largely affects characteristics of ferroelectric layer so that, in case of using $Ta_2O_5$ layer as a dielectric material, a capacitor having a MIS (Metal-Insulator-Silicon) structure is used instead of a conventional NO (Nitride-Oxide) capacitor. A plate electrode, which is a top electrode of a $Ta_2O_5$ capacitor, is a stacked structure of polysilicon/TiN or polysilicon/WN. A storage electrode, which is a bottom electrode, is a polysilicon of which the surface is thermally treated by the rapid thermal nitration (RTN) method.

The thickness of the $Ta_2O_5$ ferroelectric layer has to be reduced to obtain the desired capacitance according to integration of semiconductor devices. In order to reduce the thickness of the $Ta_2O_5$ ferroelectric layer, a post-thermal treatment is important after forming the capacitor. Even if it is not apparent how much the thickness of $Ta_2O_5$ ferroelectric layer may be reduced, the limit thickness is about 20 Å to 30 Å. If the thickness is reduced, there may be a problem of leakage current increasing.

In an effort to solve the problem described above, the thickness of the ferroelectric layer has been reduced by using metal materials as a bottom electrode. Since the polysilicon layer is used as a bottom electrode in the $Ta_2O_5$ capacitor having a MIS structure, a thickness of effective oxide layer (Tox) becomes much larger when a thermal treatment is performed so that a desired capacitance, which is necessary for an operation of highly integrated semiconductor device, is limited. Accordingly, as a metal storage node is used instead of the polysilicon storage node, a generation of an oxide layer is protected so that the thickness of $Ta_2O_5$ layer is reduced. However, when metal materials are used as a bottom electrode, there is a problem in that a leakage current of the MIM (Metal-Insulator-Metal) $Ta_2O_5$ capacitor increases. Namely, the thickness of effective oxide layer may be reduced to 30 Å by using the metal storage electrode in the $Ta_2O_5$ capacitor having the MIM structure. However, a stable layer is not formed due to a surface reaction of the $Ta_2O_5$ ferroelectric layer and the metal bottom electrode so that it is difficult to guarantee a good leakage current characteristic and to be applied in a manufacture of semiconductor device. When the capacitor electrode is formed with a metal layer, a reaction of the metal layer and the polysilicon layer used as a conductive plug or a silicon layer in a substrate has to be prevented and a diffusion barrier layer has to be essentially formed to protect an oxygen diffusion when the ferroelectric layer is deposited.

When, in the MIM structure, a Ru layer is used as a metal bottom electrode, a low pressure chemical deposition (LPCVD) method is used as a deposition method. However, when the Ru layer is deposited by the LPCVD method, a surface of the Ru layer is uneven and oxygen atoms remain in the Ru layer so that the leakage current is increased and the remaining oxygen atoms oxidize a TiN layer, which is used as a barrier metal layer, and then causes the film to lift off. Accordingly, it is, also, difficult to be applied in a highly integrated semiconductor device.

An approach to solve this problem is to deposit a seed layer by the physical vapor deposition (PVD) method before the Ru layer is deposited and then Ru is deposited by the LPCVD method so that surface roughness is improved. However, there are disadvantages in that processes are complex and the step coverage becomes inferior.

SUMMARY

The inventions described herein provide methods for fabricating a ferroelectric capacitor having a two steps Ru bottom electrode in order to improve a surface roughness and a current leakage characteristic thereof in a semiconductor device.

In accordance with an aspect of the inventions, there is provided a method for fabricating a capacitor in a semiconductor device. A semiconductor substrate is provided. A bottom electrode is formed by sequentially depositing Ru through a PECVD process (hereinafter, referred to PECVD-Ru) and Ru through a LPCVD process (hereinafter, referred to LPCVD-Ru) on the semiconductor substrate. A $Ta_2O_5$ dielectric layer is formed on the bottom electrode. Finally a top electrode is formed on the $Ta_2O_5$ dielectric layer.

In accordance with another aspect of the inventions, there is provided a method for fabricating a semiconductor device. A semiconductor substrate is provided. A first interlayer insulating layer is formed. This insulating layer has a contact hole on the semiconductor substrate. A contact plug is formed with conductive materials in the contact hole. A second interlayer insulating layer is formed on the contact plug and the first interlayer insulating layer. A storage node hole is formed by selectively etching the second interlayer insulating layer. A bottom electrode is formed by sequentially depositing Ru in order of a PECVD technique and a LPCVD technique. A dielectric layer is formed on the bottom electrode. A top electrode is formed on the dielectric layer.

BRIEF DESCRIPTION OF THE DRAWINGS

The above and other features of the inventions will become apparent from the following description of preferred embodiments taken in conjunction with the accompanying drawings, in which.

DETAILED DESCRIPTION

Hereinafter, an exemplary method for fabricating a capacitor of semiconductor device according to the inventions will be described in detail referring to the accompanying drawings.

A $Ta_2O_5$ layer or a TaON layer is used as a ferroelectric layer in the present invention. The TaON layer has a higher dielectric constant than $SiO_2$, $Si_3N_4$, NO (Nitride-Oxide) or ONO (Oxide-Nitride-Oxide) layer and can improves an unstable stoichiometry of a $Ta_2O_5$ layer. Also, a Ru layer is used as a bottom electrode and the Ru layer is formed through two deposition processes. A part of a Ru (Hereinafter, referred to as PECVD-Ru) layer is deposited at an ambient of a reaction gas, such as $NH_3$ or $H_2$, by the PECVD method and then a Ru (hereinafter, referred to as LPCVD-Ru) layer is deposited at an ambient of a reaction gas, such as $NH_3$ gas or the like, by the LPCVD method. Since the LPCVD-Ru layer is deposited on the PECVD-Ru layer, the surface roughness is improved. Also, since the $NH_3$ gas is used as a reaction gas, oxygen atoms remaining in the layer is removed. Accordingly, oxidation of the TiN layer, which is used as a barrier metal, generated through the thermal processes after the TaON or $Ta_2O_5$ ferroelectric layer deposition is prevented and a TaON or $Ta_2O_5$ capacitor having a low leakage current can be obtained. A bottom electrode is a storage electrode and is a structure selected from the group consisting of a simple stack structure, a cylinder structure, a multiple pins structure, a concave structure and other structures. In the preferred embodiment of the present invention, the structure of the storage electrode of the cylinder type is used.

TABLE 1 shows a comparison of atomic force microscope data between when the LPCVD-Ru layer is deposited after depositing the PECVD-Ru layer and when the LPCVD-Ru layer is only deposited.

TABLE 1

|  | Rms (Root Mean square) | P_v (Peak to value) |
| --- | --- | --- |
| LPCVD-Ru deposition after PECVD-Ru deposition | 2.53 nm | 19.24 nm |
| Only LPCVD-Ru deposition | 4.19 nm | 82.46 nm |

Where, Rms represents a root mean square of the surface roughness and P_v is a difference between the maximum point and the minimum point of the surface roughness. Referring to TABLE 1, when the LPCVD-Ru layer is deposited after the PECVD-Ru layer deposition, the surface roughness is better than the surface roughness depositing the only LPCVD-Ru layer. The top electrode corresponds to a cell plate and is formed with a Ru layer, a TiN layer or the like according to the present invention.

Figure 1:
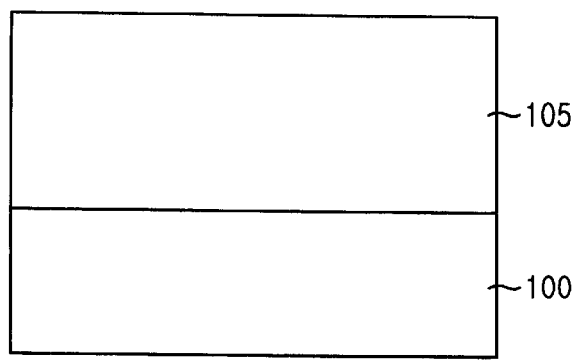
FIGS. 1 to 10 are cross-sectional views showing a process fabricating a capacitor according to the present invention.

FIG. 1 is a cross-sectional view showing that a first interlayer insulating layer 105 is formed on a semiconductor substrate 100 according to the present invention.

A field oxide layer, a gate oxide layer and a metal oxide semiconductor field effect transistor (MOSFET) including source/drain electrodes, which are not shown in FIG. 1, are formed in the semiconductor substrate 100.

Figure 2:
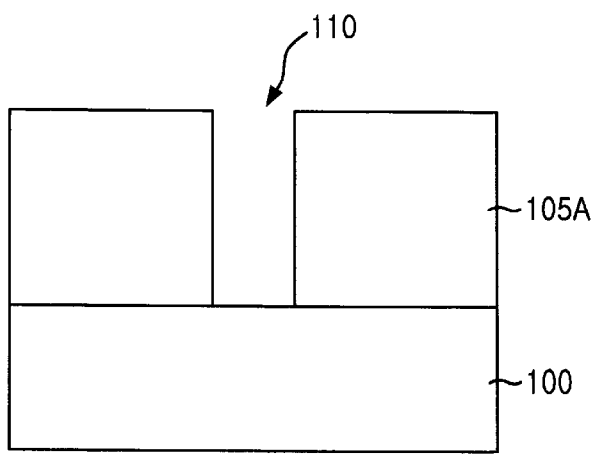

FIG. 2 is a cross-sectional view showing a storage contact hole 110 formed in the first interlayer insulating layer 105 according to the present invention.

The storage contact hole 110 is formed by selectively etching the first interlayer insulating layer 105 and a first interlayer insulating layer pattern 105A is formed.

Figure 3:
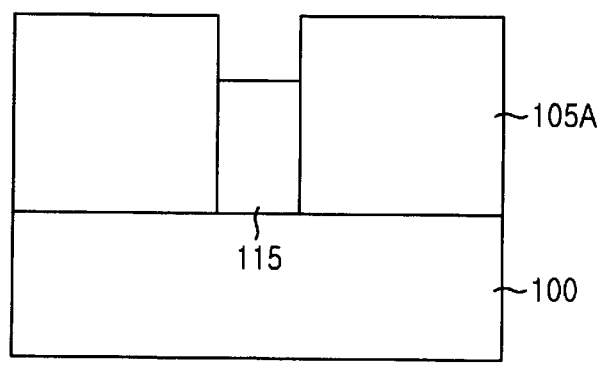

FIG. 3 is a cross-sectional view showing a recessed polysilicon 115 in the storage contact hole.

A doped polysilicon is deposited on the entire structure by the CVD method and the polysilicon is etched back until a surface of the interlayer insulating layer 105 is exposed. At this time, the polysilicon layer is heavily etched back in order to remain only in the contact hole 110 so that the polysilicon 115 is recessed in the contact hole 110.

Figure 4:
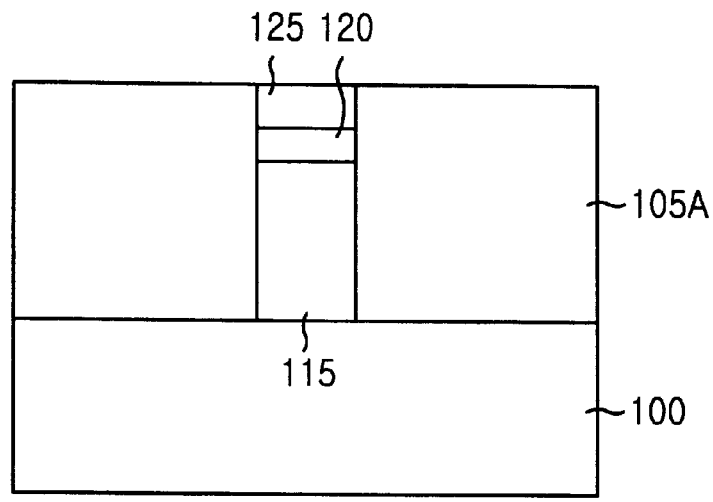

FIG. 4 is a cross-sectional view showing a silicide layer 120 and a barrier metal layer 125 formed on the polysilicon 115 in the contact hole 110. After cleaning the recessed polysilicon, Ti is deposited on the entire structure and the rapid thermal processing (RTP) is performed in order to form a titanium silicide (TiSix) layer 120. The non-reacted Ti is removed by wet etching. WN or W may be used instead of Ti. This titanium silicide layer 120 is to form an Ohmic contact with the polysilicon for reducing a contact resistance.

Subsequently, a barrier metal is deposited and then a chemical mechanical polishing (CMP) process is performed for planarization. The barrier metal layer 125 is to protect that the polysilicon plug in a boundary between the polysilicon plug and the storage electrode is oxidized when a thermal treatment is performed at a high temperature and an at ambient of an oxygen gas in order to crystallize a dielectric material. The barrier metal is selected from the group consisting of TiN, TaN, TiSiN, TaAlN and combined materials thereof and is deposited by the physical vapor deposition (PVD) method or the CVD method.

Figure 5:
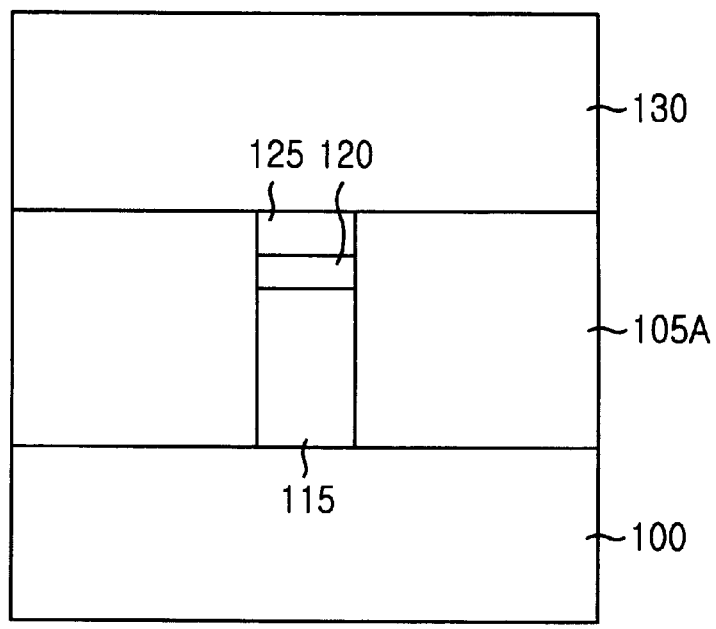

FIG. 5 is a cross-sectional view showing a second interlayer insulating layer 130 to form a cylinder type of capacitor according to the present invention. The second interlayer insulating layer 130 may include an etch stopper, an oxide layer and a reflection protecting layer. Also, the second interlayer insulating layer 130 may include an etch stopper, an oxide layer and a BPSG layer. Since the etching stopper has a lower etching selection ratio than that of the oxide layer and the BPSG layer, it can be used as an etching stopping layer and the etching stopper is formed with a material selected from the group consisting of SiN, $Al_2O_3$, SiON and combined materials thereof.

Figure 6:
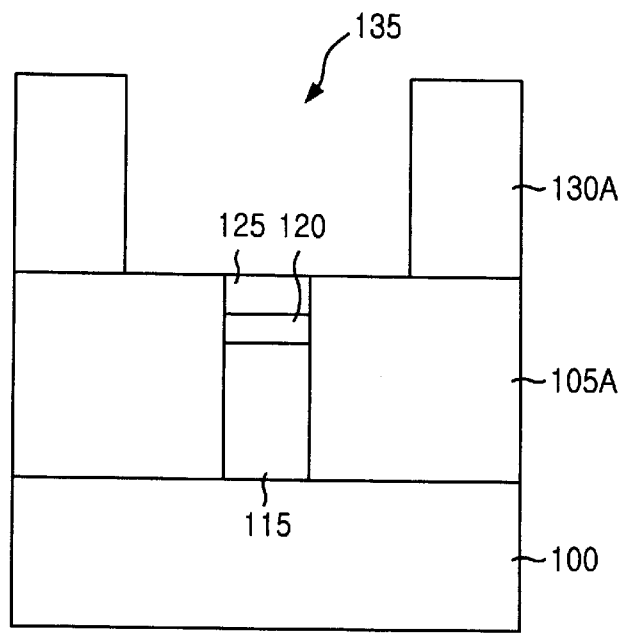

FIG. 6 is a cross-sectional view showing a storage node hole 135 and a second interlayer insulating layer pattern 130A by selectively etching the second interlayer insulating layer 130 according to the present invention.

Figure 7:
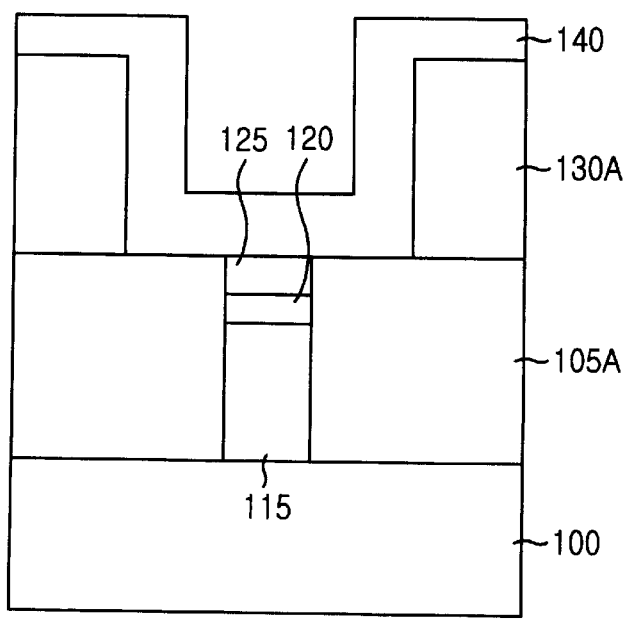

FIG. 7 is a cross-sectional view showing a conductive layer 140, which will be a bottom electrode, formed on the entire structure according to the present invention. The bottom electrode is formed by depositing the PECVD-Ru layer and then depositing the LPCVD-Ru layer.

The PECVD-Ru layer deposition process is as follows. A state of $Ru(CH_3COCHCOCH_2CH_3CH_2CH_3)_3$ (Tri (2,4-octanedionato)ruthenium), which is a reaction source, is changed into a gas state. A temperature of substrate is about 200° C. to 350° C., a flow rate of a $NH_3$ or $H_2$ reaction gas is about 50 sccm to 1000 sccm and a pressure of a reaction furnace is about 0.1 torr to 2 torr. Also, R. F. power is about 30 watts to 400 watts. A sub heater is used as a ground and a shower head is used as an electrode. The $NH_3$ or $H_2$ gas is used as the reaction gas for removing the oxygen atoms remaining in the Ru layer.

Subsequently, the LPCVD-Ru layer is deposited. The reaction conditions are nearly identical to the PECVD method. Namely, a temperature of substrate is about 200° C. to 350° C., a flow rate of $NH_3$ or $H_2$ reaction gas is about 50 sccm to 1000 sccm and a pressure of reaction chamber is about 0.1 Torr to 2 Torr. Actually, the PECVD-Ru deposition and the LPCVD-Ru deposition are carried out in-situ at the same chamber.

Figure 8:
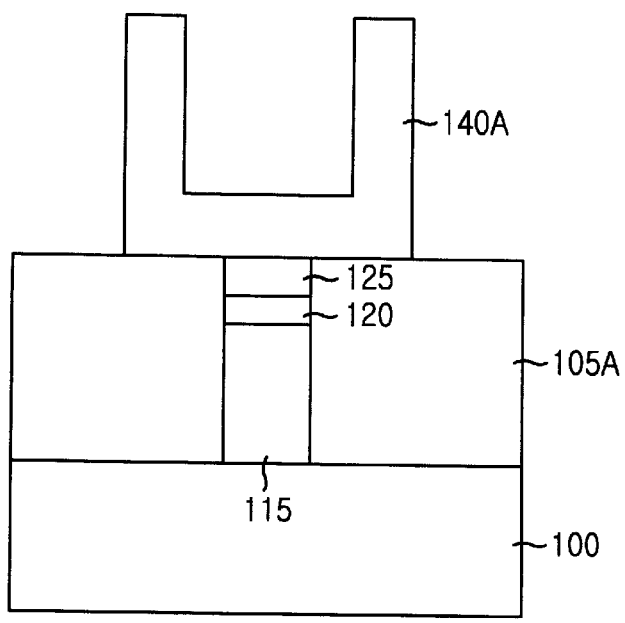

FIG. 8 is cross-sectional view showing a bottom electrode pattern 140A formed by separating each storage node from the conductive layer 140 and removing the second interlayer insulating layer pattern 130A by wet etching.

A sacrifice layer, which can fully fill the storage node hole 135, is formed with photo resist materials or oxides. A portion of the bottom electrode and a portion of the sacrifice layer are removed by an etch back process or a CMP process until the upper surface of the first interlayer insulating layer 130A is exposed so that the bottom electrode layer 140 is separated into a plurality of bottom electrodes. At this time, a portion of sacrifice layer remains on the bottom electrode in the storage node hole 135. The remaining sacrifice layer is removed by a wet etching process or an ashing process. When the sacrifice layer is a photo resist material, the remaining sacrifice layer is removed by the ashing process and, when the sacrifice layer is the oxide layer, the remaining sacrifice layer is removed by the wet etching process.

Subsequently, the second interlayer insulating layer pattern 130A is removed by the wet etching process so that the bottom electrode, which is a cylinder type, is finally formed.

Figure 9:
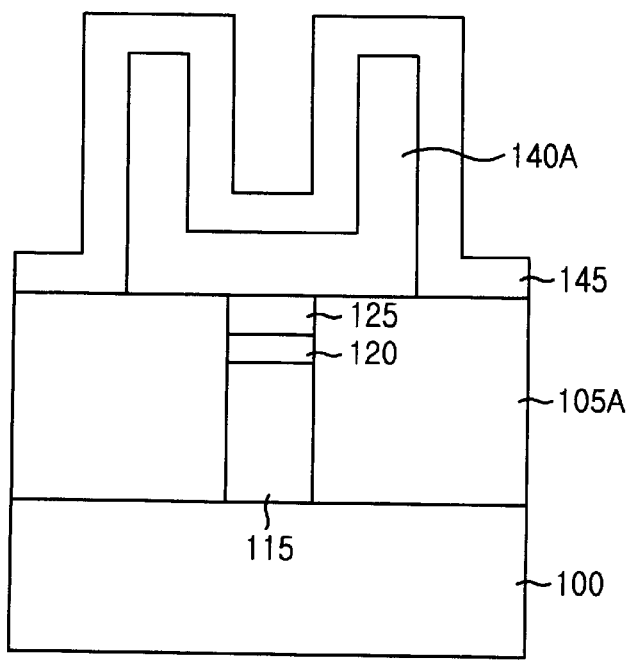

FIG. 9 is a cross-sectional view showing a ferroelectric layer deposited on the entire structure according to the present invention.

A tantalum ethylate $(Ta(OC_2H_5)_5)$, which is a reaction raw material of $Ta_2O_5$, is a liquid state at room temperature. The tantalum ethylate $(Ta(OC_2H_5)_5)$ of a liquid state is changed into a tantalum ethylate $(Ta(OC_2H_5)_5)$ of a gas state at a vaporizer maintaining a temperature of about 170° C. to 190° C. A flow rate of a reaction gas, an $O_2$ gas, is about 10 sccm to 1000 sccm and a pressure in a reaction chamber is about 0.1 Torr to 2 Torr. The $Ta_2O_5$ layer is deposited on the substrate pre-heated at a temperature of about 300° C. to 400° C.

Subsequently, a $N_2O$ plasma thermal treatment is performed at a temperature of about 300° C. to 500° C. in order to removing oxygen and carbon atoms in the $Ta_2O_5$ layer. Also, instead of the plasma thermal treatment, an ultraviolet-ozone ($UV-O_3$) gas treatment may be applied.

A rapid thermal oxidation (RTP) process is performed at a temperature of about 500° C. to 650° C. for 30 seconds to 60 seconds by using $N_2$ and $O_2$ gases. At this time, the $Ta_2O_5$ layer is crystallized.

Figure 10:
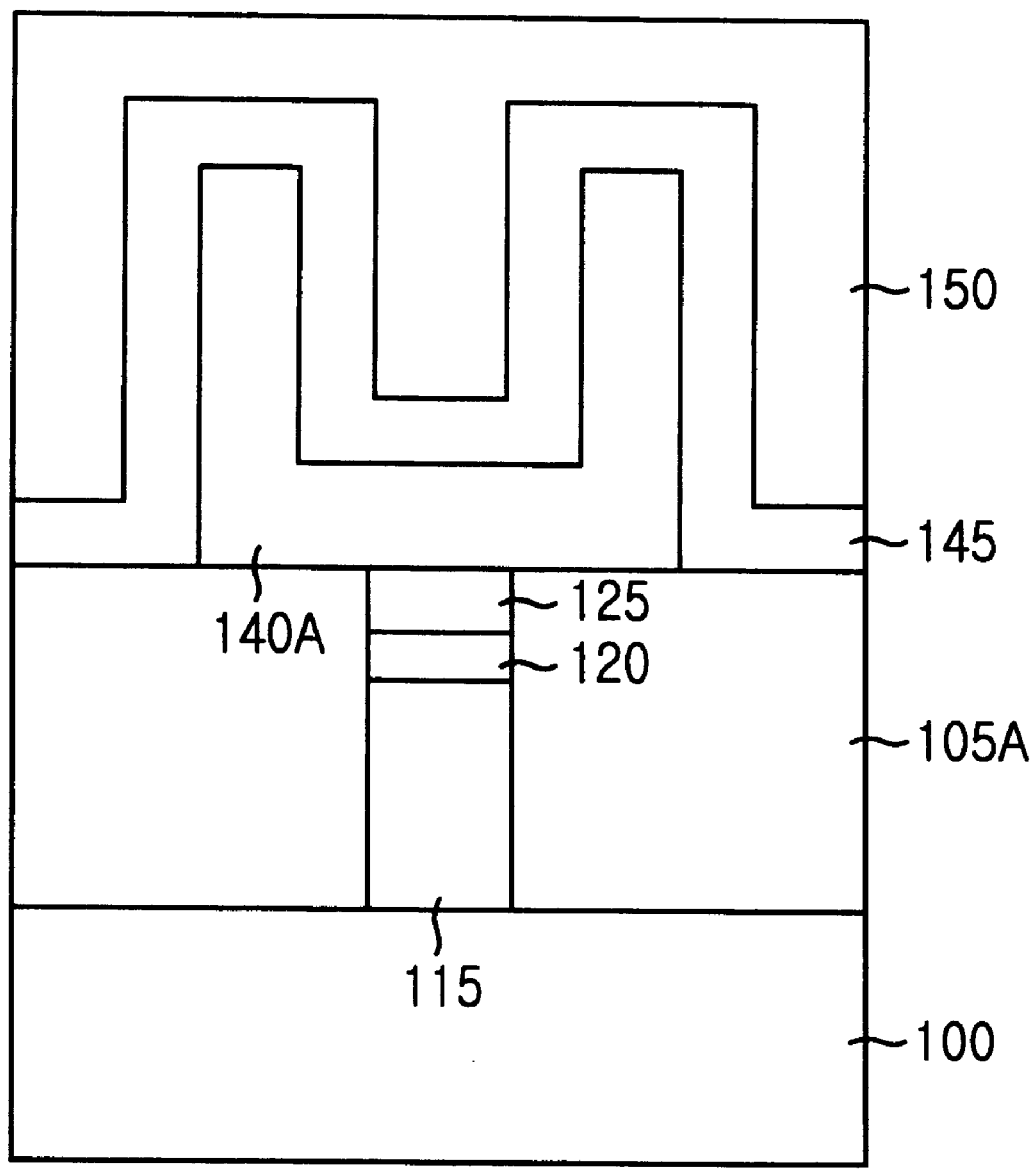

FIG. 10 is a cross-sectional view showing a semiconductor device after completely forming a top electrode.

A Ru layer or a TiN layer is deposited as a top electrode.

Accordingly, as Ru is deposited by the LPCVD method on the Ru layer, which is deposited by the PECVD method, a surface roughness is improved compared with the conventional MIM capacitor. Also, when Ru layer is deposited by PECVD method, oxygen remaining in the Ru layer is removed by using a reaction gas, a $NH_3$ gas or a $H_2$ gas and, when the Ru layer is deposited by the LPCVD method, the oxygen atoms are removed by using a reaction gas, a $NH_3$ gas, so that oxidation of the barrier metal layer is protected at post thermal treatment processes and a low current leakage of TaON or $Ta_2O_5$ capacitor is formed.

While the inventions have been described with respect to a particular embodiment, it will be apparent to those skilled in the art that various changes and modifications may be made without departing from the spirit and scope of the inventions as defined in the following claims.

What is claimed is:

1. A method for fabricating a capacitor in a semiconductor device, comprising:
   providing a semiconductor substrate;
   forming a bottom electrode by sequentially depositing Ru through a PECVD process (hereinafter, referred to PECVD-Ru) and Ru through a LPCVD process (hereinafter, referred to LPCVD-Ru) on the semiconductor substrate;
   forming a $Ta_2O_5$ dielectric layer on the bottom electrode; and
   forming a top electrode on the $Ta_2O_5$ dielectric layer.

2. The method as recited in claim 1, wherein the PECVD-Ru is deposited under conditions at which a reaction source is $Ru(CH_3COCHCOCH_2CH_3CH_2CH_3)_3$ (tirs(2,4-octanedionato) ruthenium), a temperature of semiconductor substrate is about 200° C. to 350° C., a reaction gas is a $NH_3$ gas or a $H_2$ gas at flow rate of about 50 sccm to 1000 sccm and a pressure of a reaction chamber is about 0.1 Torr to 2 Torr.

3. The method as recited in claim 1, wherein the PECVD process is performed by which R. F. power is 30 watt to 400 watt, a sub heater is employed as a ground and a shower head is employed as an electrode.

4. The method as recited in claim 1, wherein the LPCVD-Ru is deposited at conditions of which a reaction source is $Ru(CH_3COCHCOCH_2CH_3CH_2CH_3)_3$ (tirs(2,4-octanedionato) ruthenium), a temperature of semiconductor substrate is about 200° C. to 350° C., a reaction gas is a $O_2$ gas at flow rate of about 50 sccm to 1000 sccm and a pressure of a reaction chamber is about 0.1 Torr to 2 Torr.

5. The method as recited in claim 1, wherein the PECVD process and LPCVD process are carried out in-situ at the same chamber.

6. The method as recited in claim 1, wherein the forming of the $Ta_2O_5$ dielectric layer includes:
   depositing a $Ta_2O_5$ layer on the semiconductor substrate;
   performing a $N_2O$ plasma thermal treatment or ultraviolet-ozone ($UV/O_3$) thermal treatment for the $Ta_2O_5$ layer; and
   performing a rapid thermal oxidation (RTO) process for the $Ta_2O_5$ layer.

7. The method as recited in claim 6, wherein the depositing a $Ta_2O_5$ layer is performed at conditions of which a tantalum ethylate $(Ta(OC_2H_5)_5)$ is a source gas, a flow rate of reaction gas, $O_2$ gas, is 10 sccm to 1000 sccm, a pressure in the reaction chamber is 0.1 Torr to 2 Torr and a temperature of the substrate is 300° C. to 400° C.

8. The method as recited in claim 6, wherein the $N_2O$ plasma thermal treatment is performed at a temperature of 300° C. to 500° C.

9. The method as recited in claim 6, wherein the RTO process is performed for 30 seconds to 60 seconds by using $N_2$ and $O_2$ gases at a temperature of 500° C. to 650° C.

10. The method as recited in claim 1, wherein the top electrode is formed with Ru or TiN.

11. A method for fabricating a semiconductor device, comprising:

provonding a semiconductor substrate;

forming a first interlayer insulating layer having a contact hole on the semiconductor substrate;

forming a contact plug with conductive materials in the contact hole;

forming a second interlayer insulating layer on the contact plug and the first interlayer insulating layer;

forming a storage node hole by selectively etching the second interlayer insulating layer;

forming a bottom electrode by sequentially depositing Ru in order of a PECVD technique and a LPCVD technique;

forming a dielectric layer on the bottom electrode; and forming a top electrode on the dielectric layer.

12. The method as recited in claim 11, wherein the forming of the contact plug includes:

forming a contact hole by selectively etching the first interlayer insulating layer;

burying polysilicon in the contact hole and recessing the polysilicon by an etch back process; and forming a plug by sequentially burying a silicide and a barrier metal layer on the recessed polysilicon in the contact plug and performing planarization thereof.

13. The method as recited in claim 12, wherein the silicide is formed by performing a rapid thermal oxidation (RTO) process for Ti, which is deposited on the plug.

14. The method as recited in claim 12, wherein the barrier metal layer is formed with a material selected from a group of TiN, TaN, TaSiN, TaAlN and a combined material thereof by a PVD process or CVD process.

15. The method as recited in claim 11, wherein the step of forming the bottom electrode includes:

depositing Ru, as a conductive layer, in order of a PECVD technique and a LPCVD technique on the storage node hole and the second interlayer insulating layer;

forming a sacrifice layer, which has a enough thickness to fully fill the storage node hole, on the conductive layer;

separating the conductive layer from neighbor conductive layers by removing a portion of the conductive layer and the sacrifice layer until a top surface of the second interlayer insulating layer is exposed;

removing a remaining sacrifice layer; and removing a remaining the second interlayer insulating layer by wet etching.

16. The method as recited in claim 11, wherein the dielectric layer is formed with a TaON layer and a $Ta_2O_5$ layer.

17. The method as recited in claim 11, wherein the top electrode is formed with a Ru layer or a TiN layer.

* * * * *